(12) United States Patent
Baek et al.

(10) Patent No.: US 7,881,146 B2
(45) Date of Patent: Feb. 1, 2011

(54) SEMICONDUCTOR MEMORY APPARATUS CAPABLE OF SELECTIVELY PROVIDING DECODED ROW ADDRESS

(75) Inventors: Chang-Ki Baek, Ichon (KR); Ho-Uk Song, Ichon (KR)

(73) Assignee: Hynix Semiconductor Inc. (KR)

(*) Notice: Subject to any disclaimer, the term of this patent is extended or adjusted under 35 U.S.C. 154(b) by 244 days.

(21) Appl. No.: 12/168,575

(22) Filed: Jul. 7, 2008

(65) Prior Publication Data

US 2009/0040860 A1 Feb. 12, 2009

(30) Foreign Application Priority Data

Aug. 10, 2007 (KR) .................. 10-2007-0080622

(51) Int. Cl.
*G11C 8/00* (2006.01)
(52) U.S. Cl. .................. 365/230.06; 365/230.03; 365/230.08
(58) Field of Classification Search ............ 365/230.06, 365/230.03, 230.08, 189.05, 185.23, 189.03, 365/189.09, 230.02
See application file for complete search history.

(56) References Cited

U.S. PATENT DOCUMENTS

| 5,483,497 | A | 1/1996 | Mochizuki et al. |
| 6,125,076 | A * | 9/2000 | Ishikawa .............. 365/230.06 |
| 6,937,537 | B2 | 8/2005 | Pfeiffer et al. |
| 2007/0242551 | A1 | 10/2007 | Johnson |

FOREIGN PATENT DOCUMENTS

| JP | 2007-095262 | 4/2007 |
| KR | 1020020057054 A | 7/2002 |

\* cited by examiner

*Primary Examiner*—Dang T Nguyen
(74) *Attorney, Agent, or Firm*—Baker & McKenzie LLP

(57) ABSTRACT

A semiconductor memory apparatus includes a first bank block including a first bank group, a second bank block including a second bank group, and an address control unit that receives an address signal to selectively provide a decoded row address signal to the first bank block or the second bank block in response to a bank address signal.

9 Claims, 5 Drawing Sheets

SEMICONDUCTOR MEMORY APPARATUS CAPABLE OF SELECTIVELY PROVIDING DECODED ROW ADDRESS

CROSS-REFERENCES TO RELATED APPLICATION

The present application claims priority under 35 U.S.C. §119(a) to Korean application number 10-2007-0080622, filed in the Korean Intellectual Property Office on Aug. 10, 2007, which is incorporated herein by reference in its entirety as if set forth in full.

BACKGROUND

1. Technical Field

The embodiments described herein relate to a semiconductor memory apparatus. More particularly, to a semiconductor memory apparatus for providing a bank with a decoded row address.

2. Related Art

As electronic products have tended toward miniaturization, semiconductor packages installed in the electronic products have also tended toward miniaturization, lightweight and multi-function capability. In this regard, a BGA (ball grid array) having a compact size, in particular, and an FBGA (fine pitch ball grid array), which is a CSP (chip scale package), have been developed to provided such features and functionality. A plurality of semiconductor chips can be stacked in the BGA package so that one package can perform multiple functions. Such a BGA package, in which plural semiconductor chips are stacked, is called an MCP (multi-chip package). Semiconductor chips provided in a MCP have pads at the edges thereof so that the semiconductor chips can be electrically connected to each other.

For instance, such a semiconductor chip can include a semiconductor memory die, such as a die for a Dynamic Random Access Memory (DRAM), which can configured as a multi-bank die, especially if the chip is to be deployed in a mobile product.

The banks receive address signals from a pad arranged at an edge of the semiconductor chip. At the same time, decoded address signals are supplied to the banks. Thus, a word line corresponding to a decoded row address of a bank, which is selected according to bank active information, is selected.

However, in such a semiconductor chip, a signal path of a row address signal from the pad to the multi-bank is too long, so that a signal delay may occur. In addition, whenever address information is changed, the decoded row address signal corresponding to the changed address information must be provided to each bank, increasing power consumption. As a result, semiconductor chips configured as described above are not suitable for a personal portable, or mobile product requiring low power consumption, such as a cellular phone, a PCS (personal communication service) phone, or a PDA (personal digital assistant).

SUMMARY

A semiconductor memory apparatus capable of selectively providing a decoded row address to a bank block is described herein.

In one aspect, a semiconductor memory apparatus includes an address decoding unit that is configured to receive an address signal and to provide a decoded row address signal, a first decoded bank address signal group, and a second decoded bank address signal group, a first switching unit that is configured to provide the decoded row address signal when the first decoded bank address signal group is activated, and a second switching unit that is configured to provide the decoded row address signal when the second decoded bank address signal group is activated.

In another aspect, a semiconductor memory apparatus includes a first bank block configured to include a first bank group, a second bank block configured to include a second bank group, and an address control unit that is configured to receive an address signal to selectively provide a decoded row address signal to the first bank block or the second bank block in response to a bank address signal.

In still another aspect, a decoded row address signal can be selectively supplied to a bank block configured to include a specific bank in response to a decoded bank address. Because it is not necessary to provide the decoded row address signal to all banks, the loading of the signal can be reduced. In addition, because the row address signal can be selectively provided to a selected bank block, power consumption can be reduced. These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
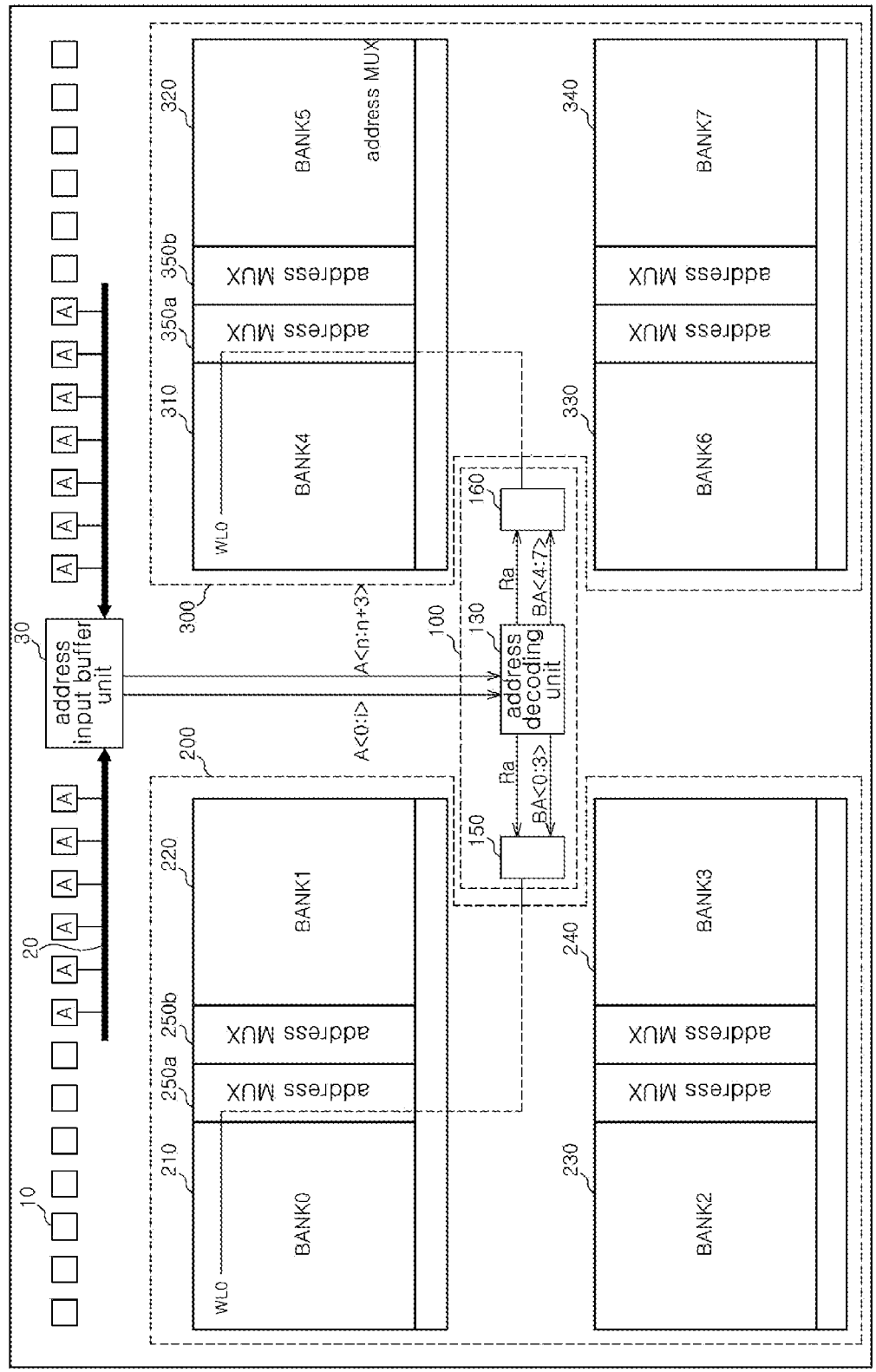
FIG. 1 is a block diagram of a semiconductor memory apparatus according to one embodiment.

FIG. 1 is a block diagram of a semiconductor memory apparatus 101 according to one embodiment. Referring to FIG. 1, a semiconductor memory apparatus 101 can include a plurality of pads 10, a signal bus line 20, an address input buffer unit 30, an address control unit 100, a first bank block 200 and a second bank block 300.

The pads 10 can be arranged at an edge of the semiconductor memory apparatus to receive signals from an exterior, such as an address signal, a clock signal, a data signal, etc. If a signal is applied to an address pad (hereinafter, referred to as an address signal), the address signal can be supplied to the address input buffer unit 30 through the signal bus line 20. The address input buffer unit 30 can be configured to generate row address signals ('A<0:i>', i=natural number) and bank address signals ('A<n:n+3>') by buffering address signals ('A<0:n+3>', n=natural number). The signal outputs from the address input buffer unit 30 can be referred to as the row address signals 'A<0:i>' and the bank address signals 'A<n:n+3>'. The address control unit 100 can include an address decoding unit 130, a first switching unit 150 and a second switching unit 160. The address decoding unit 130 can be configured to generate a decoded row address signal 'Ra' for selecting a word line of a memory cell, a first decoded bank address signal group 'BA<0:3>', and a second decoded bank address signal group 'BA<4:7>' by decoding the address signals 'A<0:n+3>'. The address decoding unit 130 can be configured to provide the decoded row address signal 'Ra' and the first decoded bank address signal group 'BA<0:3>' to the first switching unit 150, and to provide the decoded row address signal 'Ra' and the second decoded bank address signal group 'BA<4:7>' to the second switching unit 160.

The first and second switching units 150 and 160 can be configured to allow the decoded row address signal 'Ra' to be sent to the first bank block 200 or the second bank block 300 in response to the first decoded bank address signal group 'BA<0:3>' and the second decoded bank address signal group 'BA<4:7>'. The decoded row address signal 'Ra' can be selectively provided to the first bank block 200 or the second bank block 300 according to the operation of the first and second switching units 150 and 160, which are operated in response to the first decoded bank address signal group 'BA<0:3>' and the second decoded bank address signal group 'BA<4:7>'. Accordingly, the loading of the row address signal can be reduced. In addition, even if address information is changed, the changed address information can be only transferred to the corresponding bank block, so that power consumption caused by the toggle of the address signal can be reduced.

The first bank block 200 can include a first group having first to fourth banks 210 to 240 and address MUXs 250a and 250b. The first bank block 200 can be configured to receive the decoded row address signal 'RA' through the first switching unit 150. At the same time, the banks 210 to 240 can be selected in response to an activated bank address signal. The address MUXs 250a and 250b can be configured to control the banks aligned in opposition to each other and to activate the word line corresponding to the decoded row address signal 'Ra'.

The second bank block 300 can include a second group having fifth to eighth banks 310 to 340 and address MUXs 350a and 350b. The second bank block 300 can be configured to receive the decoded row address signal 'RA' through the second switching unit 160. At the same time, the banks 310 to 340 can be selected in response to an activated bank address signal. The address MUXs 350a and 350b can be configured to control the banks aligned in opposition to each other and to activate the word line corresponding to the decoded row address signal 'Ra'.

The first and second bank blocks 200 and 300 can be configured to reduce the loading of the decoded address signal 'Ra' by dividing the path of the decoded address signal 'Ra' into two sections. That is, the path of the decoded address signal 'Ra' is vertically divided into two sections along the extension direction of the semiconductor memory apparatus.

Figure 2:
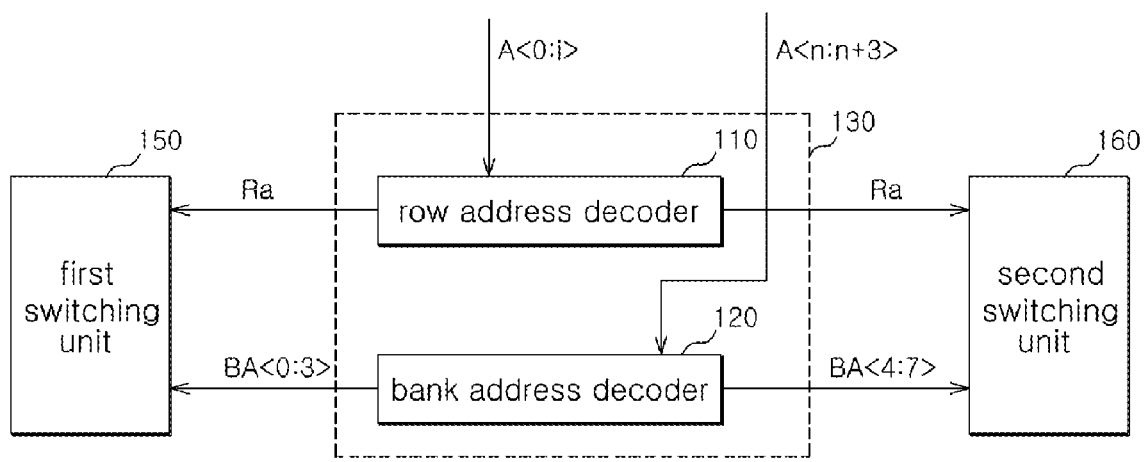
FIG. 2 is a block diagram of an address control unit included in the semiconductor memory apparatus of FIG. 1.

FIG. 2 is a block diagram of an address control unit 130 included in the semiconductor memory apparatus of FIG. 1. Referring to FIG. 2, the address decoding unit 130 can include a row address decoder 110 and a bank address decoder 120.

The row address decoder 110 can be configured to receive the row address signals 'A<0:i>' and to provide the decoded row address signal 'Ra' to the first and second switching units 150 and 160.

The bank address decoder 120 can be configured to receive the bank address signals 'A<n:n+3>' to provide the first decoded bank address signal group 'BA<0:3>' to the first switching unit 150 and to provide the second decoded bank address signal group 'BA<4:7>' to the second switching unit 160. According to one embodiment, the semiconductor memory apparatus has a multi-bank structure configured to include eight banks, so that the decoded bank address signals can be represented as 'BA<0:7>'.

That is, although the decoded row address signal 'Ra' can be provided to both first and second switching units 150 and 160, the first and second switching units 150 and 160 can be selectively activated in response to the activated first decoded bank address signal group 'BA<0:3>' or the activated second decoded bank address signal group 'BA<4:7>'.

Figure 3:
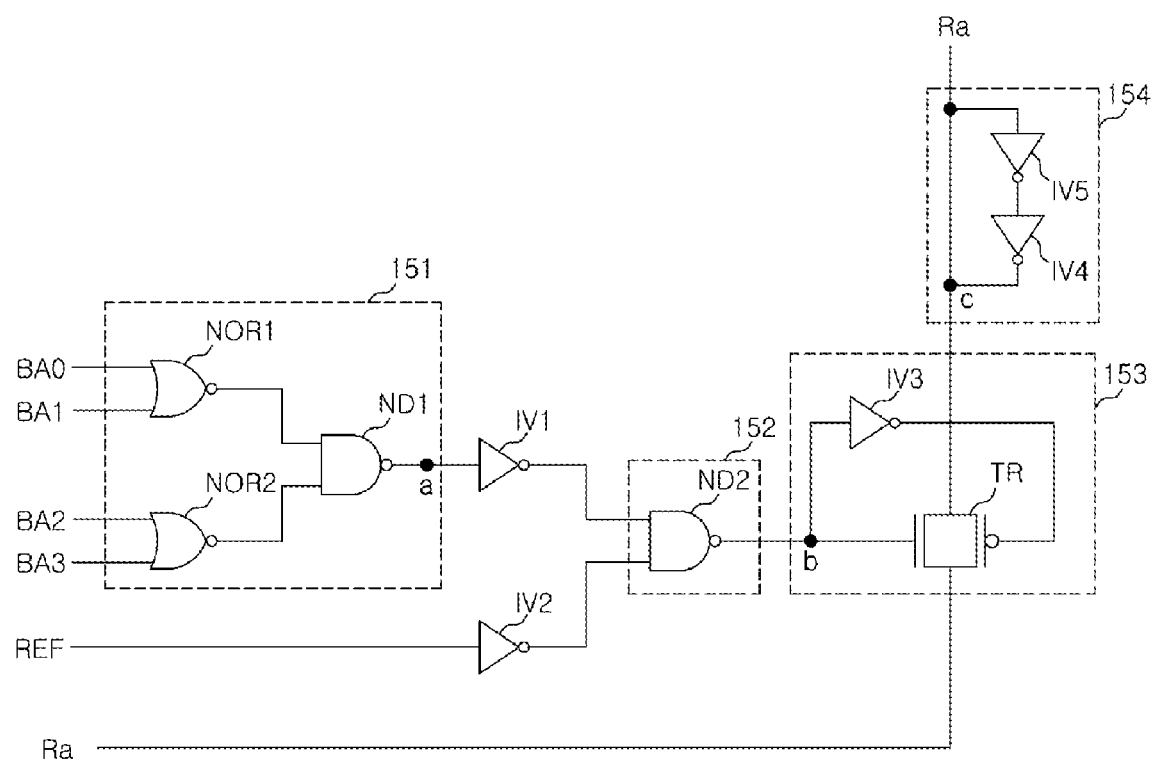
FIG. 3 is a circuit view of a first switching unit included in the address control unit of FIG. 2.

FIG. 3 is a circuit view of a first switching unit 150 included in the address control unit of FIG. 2. Although only the first switching unit 150 is illustrated for the purpose of explanation, the structure and operation of the second switching unit 160 can be identical to those of the first switching unit 150 except that the second switching unit 160 can be configured to receive the second decoded bank address signal group 'BA<4:7>'. Thus, the structure and operation of the second switching unit 160 will be understood based on the explanation of the first switching unit 150. As a result, the description for the second switching unit 160 will be omitted in order to avoid redundancy.

The first switching unit 150 can include a bank address receiving unit 151, a control unit 152, a signal transmission unit 153, and a latch unit 154.

The bank address receiving unit 151 can be configured to receive the first decoded bank address signal group 'BA<0:3>' to provide a high level signal, which can be activated by an activated bank address signal, to a node "a". The bank address receiving unit 151 can include first and second NOR gates NOR1 and NOR2 and a first NAND gate ND1. Further, the first NOR gate or the second NOR gate NOR2 can be configured to receive the first to fourth bank address signals 'BA0' to 'BA3' and to generate a low level signal through a NOR gating operation in response to one of the first to fourth bank address signals 'BA0' to 'BA3' that can be activated and can have a high level. The low level signal can be received in the first NAND gate ND1 so that the high level signal can be provided to the node "a".

The control unit 152 can be configured to receive an inverse signal of the signal on node "a" through a first inverter IV1 and an inverse signal of a refresh signal 'REF' through a second inverter IV2. In other words, the control unit 152 can be configured to provide a high level signal to a node "b" in response to the activated refresh signal 'REF' or the signal of the node "a", that is, one of the bank address signals 'BA0' to 'BA3' that can be activated. The refresh signal 'REF' can be a signal capable of activating the refresh operation in a normal mode.

The signal transmission unit 153 can include a third inverter IV3 and a transmission gate TR. If the signal on node "b" transitions to a high level, then the transmission gate TR can be turned on, so that the decoded row address signal 'Ra' can be transmitted.

The latch unit 154 can include fourth and fifth inverters IV4 and IV5 to latch a signal of a node "c".

Hereinafter, the operation of the first switching unit 150 will be described with reference to FIG. 3.

The node "a" can transition to a high level in response to the activation of one of the bank address signals 'BA 0' 'BA3'. Thus, the control unit 152 can be configured to provide a high level signal to the node "b" so that the signal transmission unit 153 can be turned on. Accordingly, the decoded row address signal 'Ra' can be transmitted to the first bank block 200 (see, FIG. 1).

Meanwhile, if all bank address signals 'BA0' to 'BA3' and refresh signals 'REF' are deactivated, then the signal transmission unit 153 can be turned off, so that transmission of the decoded row address signal 'Ra' can be blocked.

In other words, the first switching unit 150 can provide the decoded address signal 'Ra' to the first bank block 200 in response to the activated refresh signal 'REF' or activation of one of the bank address signals 'BA0' to 'BA3'. Conventionally, the decoded address signal 'Ra' is always provided to all multi-banks, so that the signal loading is increased, thereby causing a signal delay. In addition, because the decoded address signal 'Ra' is provided to all banks, power consumption is increased. However, according to the embodiments described herein, the signal can be selectively transmitted to the bank block having a specific bank in response to the activated bank address signal, thus eliminating the signal delay.

Hereinafter, a first switching unit 450 according to another embodiment will be described with reference to FIG. 4.

The first switching unit 450 can include a bank address receiving unit 451, a control unit 452, a signal transmission unit 453 and a latch unit 454.

The signal transmission unit 453 can include a third NAND gate ND3. The third NAND gate ND3 can be configured to receive an output signal from the control unit 452 and the decoded row address signal 'Ra' and to provide them to a node "d" after performing an NAND operation. Similar to the previous embodiment, the signal transmission unit 453 can be configured to transmit the decoded row address signal 'Ra' to the first bank block 200 (see, FIG. 1) through the latch unit 454 in response to the activation of one of the first bank address signals 'BA0' to 'BA3' or the activated refresh signal 'REF'.

Figure 4:
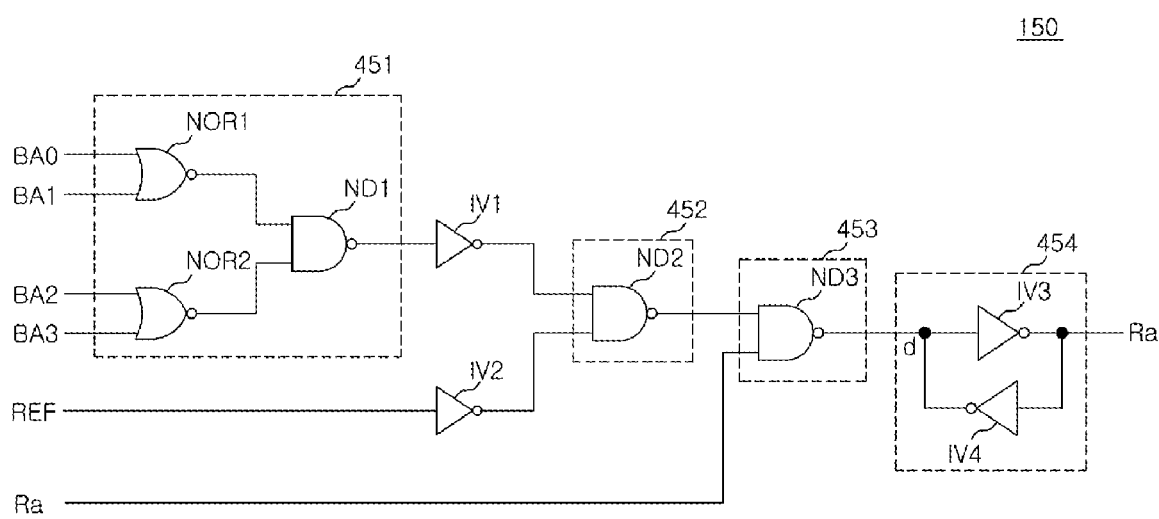
FIG. 4 is a circuit view of a first switching unit according to another embodiment.

Different from the signal transmission unit shown in FIG. 3, the signal transmission unit 453 shown in FIG. 4 can provide the row address signal 'Ra' having a fixed low level to the first bank block 200 (see, FIG. 1) through the latch unit 454 when the first bank address signal group 'BA'<0:3> and the refresh signal 'REF' are deactivated.

That is, if one of the first bank address signals 'BA0' to 'BA3' corresponding to a specific bank of the first bank block 200 (see, FIG. 1) is activated, then the signal transmission unit 453 can be configured to selectively provide the decoded row address signal 'Ra' to the first bank block 200 including the specific bank. However, if all of the first bank address signals 'BA0' to 'BA3' corresponding to the first bank block 200 (see, FIG. 1) are deactivated, then there is no specific bank in the first bank block 200 (see, FIG. 1). In this case, the signal transmission unit 453 can provide the row address signal configured to have a fixed low level to the first bank block 200. That is, if the first bank block 200 has no specific bank, then the row address signal having, e.g., a fixed low level, instead of the decoded row address signal 'Ra', can be provided to the first bank block 200, thereby reducing the loading of the activated row address signal. In addition, because it is unnecessary to provide the decoded row address signal 'Ra' to all banks when address information is changed, power consumption can be reduced.

Figure 5:
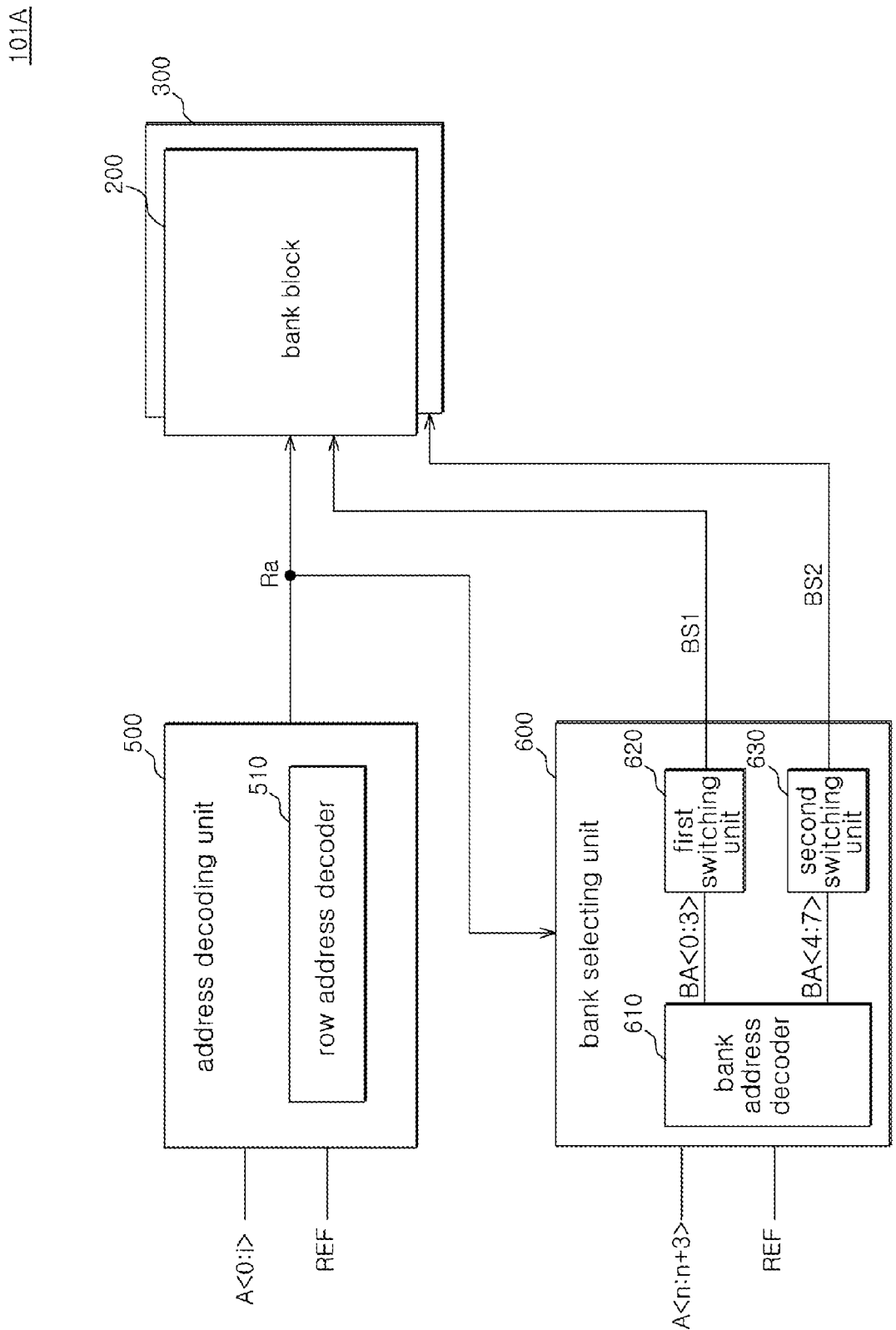
FIG. 5 is a block diagram of a semiconductor memory apparatus according to another embodiment.

Referring to FIG. 5, a semiconductor memory device 101A can include an address decoding unit 500 and a bank selecting unit 600. The address decoding unit 500 can includes a row address signal generating unit 510 and the row address signal generating unit 510 can be, for example, a row address decoder. The address decoding unit 500 receives address signals A<0:i> and generates a decoded row address signal Ra.

The bank selecting unit 600 is configured to receive bank address signals A<n:n+3> and to generate first and second bank selecting signals BS1 and BS2 for selecting a specific bank block. This bank selecting unit 600 can include a bank address decoder 610, a first switching unit 620, and a second switching unit 620.

The bank address decoder 610 receives the bank address signals A<n:n+3> and generates a first decoded bank address signal group BA<0:3> and a second decoded bank address signal group BA<4:7>. The first switching unit 620 receives the first decoded bank address signal group BA<0:3> and then outputs the first bank selecting signal BS1 to select one bank block, i.e., the first bank block 200. The second switching unit 630 receives the second decoded bank address signal group BA<4:7> and then outputs the second bank selecting signal BS2 to select one bank, i.e., the second bank block 300. Here, the first and second switching units 620 and 630 have the same configuration as that of FIG. 2. In this embodiment, each of the first and second bank selecting signals BS1 and BS2 can be used as a decoded row address signal Ra of a specific bank.

This semiconductor memory device 101A can control a specific multi-bank by selectively driving the first and second switching units 620 and 630.

As described above, according to the embodiments described herein, the decoded row address signal can be selectively provided to the bank block including the specific bank without providing the decoded row address signal to all banks. In other words, the banks can be rearranged into several block units and the decoded row address signal can be exclusively provided to the block unit including the specific bank, thereby reducing the power consumption.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompany drawings.

What is claimed is:

1. A semiconductor memory apparatus comprising:
   a first bank block;
   a second bank block;
   an address decoding unit configured to receive an address signal and to provide a decoded row address signal, a first decoded bank address signal group for providing the first bank block, and a second decoded bank address signal group for providing the second bank block;
   a first switching unit coupled with the address decoding unit, the first switching unit configured to receive the decoded row address signal, to transmit the decoded row address signal into the first bank block when the first decoded bank address signal group is activated, and to block the decoded row address signal when the first decoded bank address signal group is deactivated; and
   a second switching unit coupled with the address decoding unit, the second switching unit configured to receive the decoded row address signal, to transmit the decoded row address signal into the second bank block when the second decoded bank address signal group is activated, and to block the decoded row address signal when the second decoded bank address signal group is deactivated.

2. The semiconductor memory apparatus of claim 1, wherein the first and second switching units are further configured to block a path of the decoded row address signal when the first and second decoded bank address signal groups are deactivated.

3. The semiconductor memory apparatus of claim 1, wherein the first and second switching units are further configured to provide a fixed low level signal when the first and second decoded bank address signal groups are deactivated.

4. The semiconductor memory apparatus of claim 2, wherein the first and second switching units include:
   a bank address receiving unit configured to provide an activated high-level signal when the first and second decoded bank address signal groups is activated;

a control unit configured to control transmission of the decoded row address signal in response to a refresh signal and an output signal of the bank address receiving unit; and a signal transmission unit configured to transmit the decoded row address signal in response to an activated output signal of the control unit.

5. The semiconductor memory apparatus of claim 3, wherein the first and second switching units include:

a bank address receiving unit configured to provide an activated high-level signal when the first and second decoded bank address signal groups is activated;

a control unit configured to control transmission of the decoded row address signal in response to a refresh signal and an output signal of the bank address receiving unit; and a signal transmission unit configured to transmit a fixed low level signal in response to a deactivated output signal of the control unit.

6. A semiconductor memory apparatus comprising:

a first bank block including a first bank group;

a second bank block including a second bank group; and an address control unit configured to receive an address signal to selectively provide a decoded row address signal to the first bank block or the second bank block in response to a bank address signal, wherein the address control unit includes:

an address decoding unit configured to receive the address signal and to provide the decoded row address signal, the first decoded bank address signal group, and the second decoded bank address signal group;

a first switching unit coupled with the address decoding unit, the first switching unit configured to provide the decoded row address signal when the first decoded bank address signal group is activated; and a second switching unit coupled with the address decoding unit, the second switching unit configured to provide the decoded row address signal when the second decoded bank address signal group is activated, and wherein the first and second switching units are configured to provide a fixed low level signal to the first and second bank blocks when the first and second decoded bank address signal groups are inactivated.

7. The semiconductor memory apparatus of claim 6, wherein the first and second switching units include:

a bank address receiving unit configured to provide an activated high-level signal when the first and second decoded bank address signal groups is activated;

a control unit configured to control transmission of the decoded row address signal in response to a refresh signal and an output signal of the bank address receiving unit; and a signal transmission unit configured to transmit a fixed low level signal to the first and second bank blocks in response to an inactivated output signal of the control unit.

8. The semiconductor memory device of claim 6, wherein the first and second switching units include:

a bank address receiving unit for providing an activated high-level signal when the first and second decoded bank address signal groups is activated;

a control unit for controlling transmission of the decoded row address signal in response to a refresh signal and an output signal of the bank address receiving unit; and a signal transmission unit for transmitting a fixed low level signal to the first and second bank blocks in response to an inactivated output signal of the control unit.

9. A semiconductor memory device comprising:

an address decoding unit configured to receive address signals for outputting a decoded row address signal; and a bank selecting unit configured to receive bank address signals and the row address signal group for selecting one from a plurality of bank blocks and then selecting a bank from the selected bank block, wherein the bank selecting unit includes:

a bank address decoder configured to receive the bank address signals for generating first and second decoded bank address signal groups;

a first switching unit configured to receive the first decoded bank address signal group for selecting one bank from a first bank block; and a second switching unit configured to receive the second decoded bank address signal group for selecting one bank from a second bank block.

* * * * *